US010629410B2

(12) United States Patent
Tanigaki et al.

(10) Patent No.: US 10,629,410 B2
(45) Date of Patent: Apr. 21, 2020

(54) ELECTRON MICROSCOPE FOR MAGNETIC FIELD MEASUREMENT AND MAGNETIC FIELD MEASUREMENT METHOD

(71) Applicant: HITACHI, LTD., Chiyoda-ku, Tokyo (JP)

(72) Inventors: Toshiaki Tanigaki, Tokyo (JP); Akira Sugawara, Tokyo (JP); Tetsuya Akashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/302,854

(22) PCT Filed: Mar. 13, 2017

(86) PCT No.: PCT/JP2017/009982
§ 371 (c)(1),
(2) Date: Nov. 19, 2018

(87) PCT Pub. No.: WO2017/208560
PCT Pub. Date: Dec. 7, 2017

(65) Prior Publication Data
US 2019/0295817 A1 Sep. 26, 2019

(30) Foreign Application Priority Data

May 31, 2016 (JP) .................................. 2016-108692

(51) Int. Cl.
*H01J 37/26* (2006.01)
*H01J 37/295* (2006.01)
(52) U.S. Cl.
CPC .......... *H01J 37/266* (2013.01); *H01J 37/295* (2013.01); *H01J 2237/1514* (2013.01); *H01J 2237/2614* (2013.01)

(58) Field of Classification Search
CPC ................ H01J 37/266; H01J 37/295; H01J 2237/1514; H01J 2237/2614
(Continued)

(56) References Cited

U.S. PATENT DOCUMENTS 4,376,249 A * 3/1983 Pfeiffer ............... H01J 37/3007
250/396 ML
4,694,170 A * 9/1987 Slodzian ............... H01J 37/256
250/310
(Continued)

FOREIGN PATENT DOCUMENTS

JP 56-063761 A 5/1981
JP 8-153485 A 6/1996
(Continued)

OTHER PUBLICATIONS

M. Beleggia et al., "On the Transport of Intensity Technique for Phase Retrieval"; Ultramicroscopy; 2004; pp. 37-49.
(Continued)

*Primary Examiner* — Nicole M Ippolito
(74) *Attorney, Agent, or Firm* — Miles & Stockbridge, P.C.

(57) ABSTRACT

An electron microscope that measures electromagnetic field information separates an electric field distribution and a magnetic field distribution of a specimen with high precision to measure the electromagnetic field information. The electron microscope is configured with an electron source 1, an electron gun deflection coil 3, converging lenses 4a and 4b, an irradiation system astigmatic compensation coil 5, irradiation system deflection coils 6a and 6b, a magnetic field application coil 8, an objective lens 11, an imaging system astigmatic compensation coil 12, imaging system deflection coils 13a and 13b, a magnifying lens 17, an electron detector 18, a control analysis apparatus 20, and the like, and the control analysis apparatus 20 repeats a plurality of times (Continued)

measurement of first electromagnetic field information with an output signal from the electron detector by exercising first electron beam control after a first magnetic field is applied to the specimen 10 and then measurement of second electromagnetic field information similarly by exercising second electron beam control after a second magnetic field is applied to the specimen, and separates and measures an electric field distribution and a magnetic field distribution with high precision from the obtained first and second electromagnetic field information.

15 Claims, 11 Drawing Sheets

(58) Field of Classification Search
USPC .................. 250/306, 307, 309, 310, 311
See application file for complete search history.

(56) References Cited

U.S. PATENT DOCUMENTS

| | | | |
|---|---|---|---|
| 5,546,319 A * | 8/1996 | Satoh | B82Y 10/00 250/396 R |
| 8,188,427 B2 * | 5/2012 | Kakuta | G01N 23/225 250/306 |
| 2004/0061066 A1 | 4/2004 | Harada et al. | |
| 2007/0272861 A1 | 11/2007 | Harada et al. | |
| 2014/0319371 A1 | 10/2014 | Sugawara et al. | |
| 2016/0233049 A1 * | 8/2016 | Sasaki | H01J 37/147 |
| 2018/0233320 A1 * | 8/2018 | Ikegami | H01J 37/04 |

FOREIGN PATENT DOCUMENTS

| | | |
|---|---|---|
| JP | 2002-296333 A | 10/2002 |
| JP | 2005-197165 A | 7/2005 |
| JP | 2012-129137 A | 7/2012 |
| JP | 2014-216180 A | 11/2014 |

OTHER PUBLICATIONS

J.N. Chapman et al., "The Direct Determination of Magnetic Domain Wall Profiles by Differential Phase Contrast Electron Microscopy"; Ultramicroscopy; 1978; pp. 203-214.
International Search Report dated May 23, 2017, in International Application No. PCT/JP2017/009982.

* cited by examiner

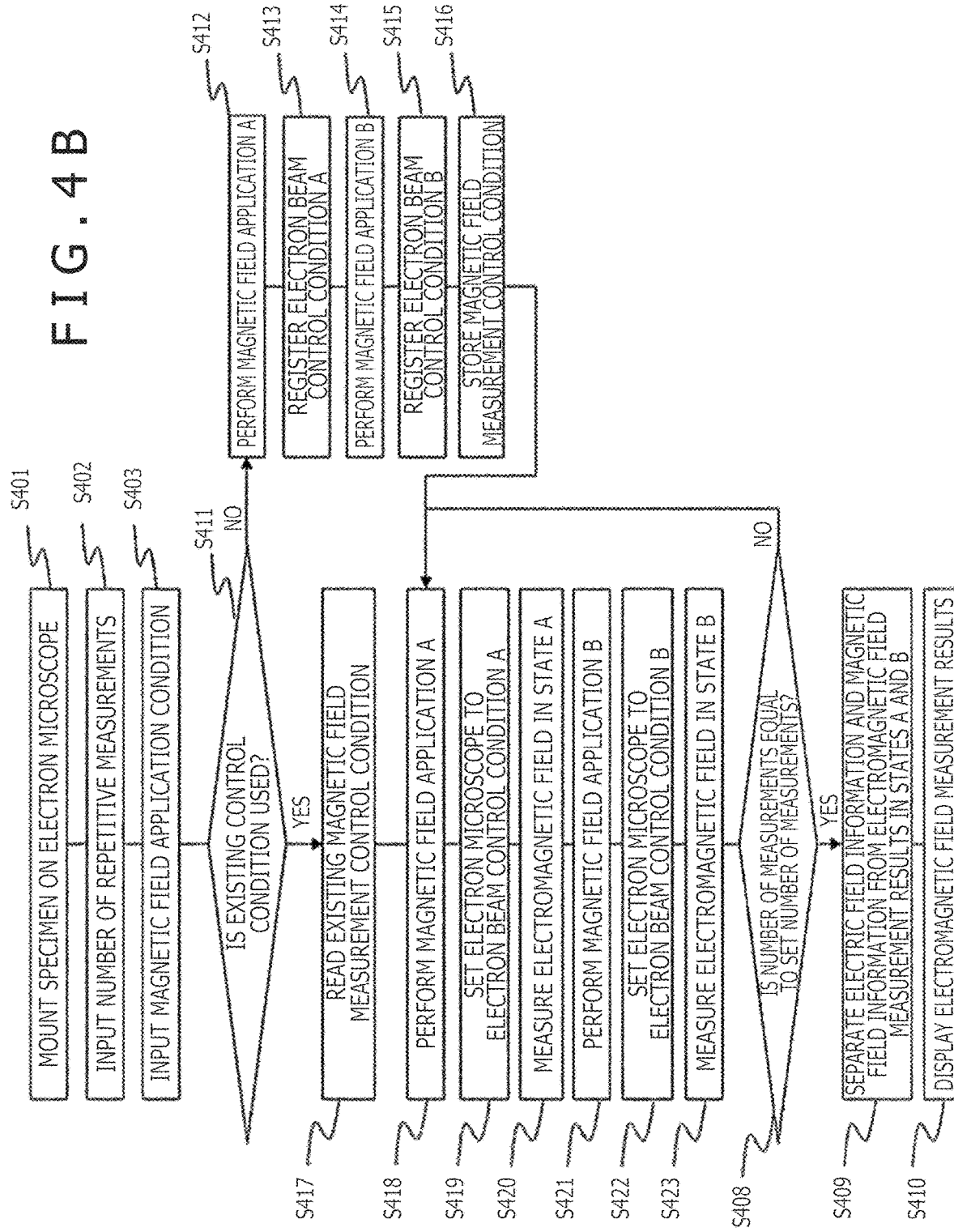

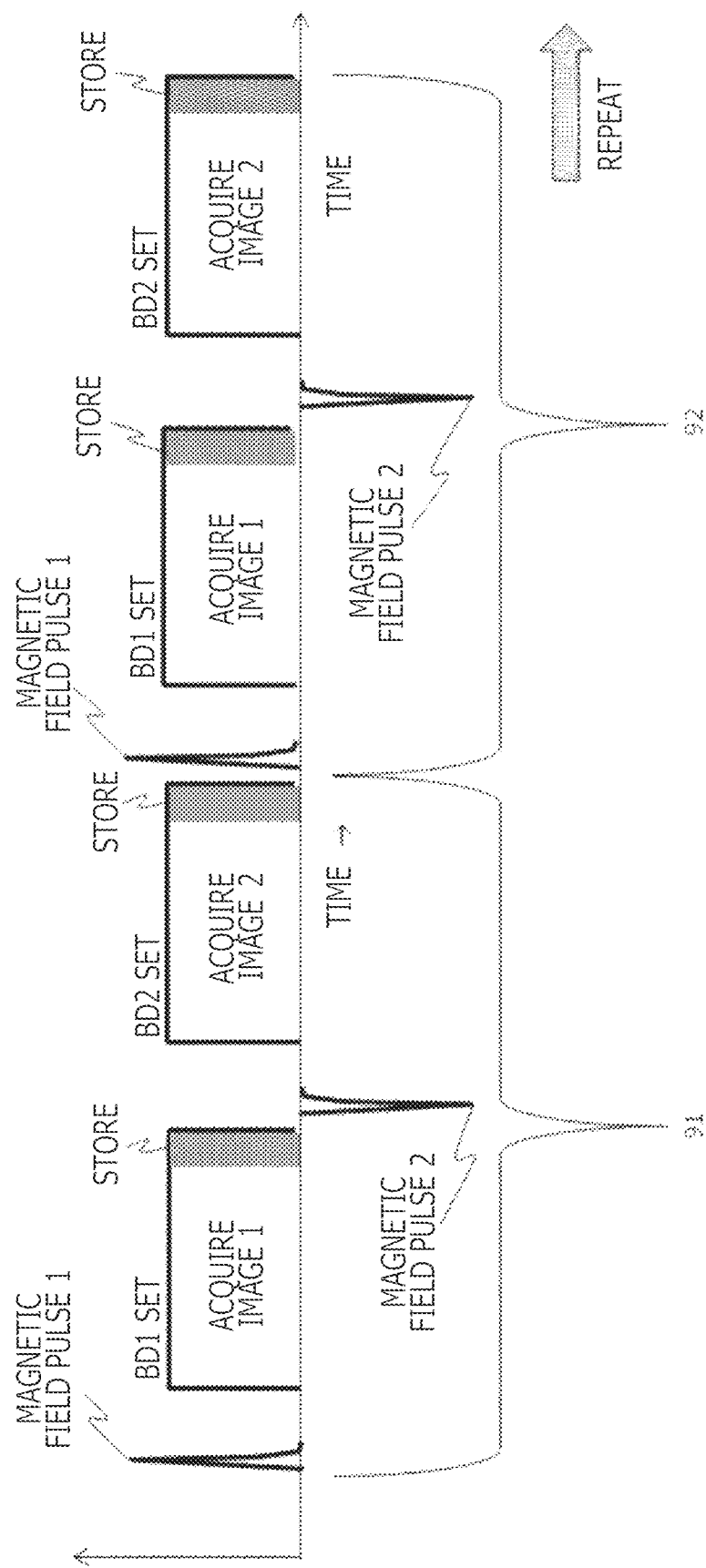

ELECTRON MICROSCOPE FOR MAGNETIC FIELD MEASUREMENT AND MAGNETIC FIELD MEASUREMENT METHOD

TECHNICAL FIELD

The present invention relates to an apparatus utilizing an electron beam and particularly relates to a technique for measuring electromagnetic field information about a specimen by detecting and analyzing electrons transmitted through the specimen.

BACKGROUND ART

A transmission electron microscope that accelerates an electron beam emitted from an electron source, irradiates a specimen with the electron beam, and detects electrons transmitted through the specimen can quantitatively measure an electromagnetic field of a substance or in a vacuum by measuring a change in the electron beam resulting from interaction between the electron beam and the electromagnetic field of the specimen. As representative methods of measuring the electromagnetic field using an electron beam, electron beam holography (Patent Document 1) that obtains interference fringes of electrons using electron beam biprisms, a method (Non-Patent Document 1) that determines an electromagnetic field from a change in a two-dimensional intensity distribution of microscope images obtained by changing a focal point of an electron microscope, and a method (Non-Patent Document 2) that determines an effect that an electromagnetic field deflects an electron beam transmitted by a specimen from positions of electrons arriving at an electron detector are known. Furthermore, a magnetic field application technique, to be described later, is disclosed in Patent Documents 2, 3, 4, and the like.

PRIOR ART DOCUMENT

Patent Document

Patent Document 1: JP-2005-197165-A
Patent Document 2: JP-2002-296333-A
Patent Document 3: JP-2012-129137-A
Patent Document 4: JP-2014-216180-A

Non-Patent Document

Non-Patent Document 1: Beleggia M, Schofield M A, Volkov V V and Zhu Y (2004) Ultramicroscopy 102 37
Non-Patent Document 2: Capman J N, Batson P E, Waddell E M and Ferrier R P (1978) Ultramicroscopy 3 203.

SUMMARY OF THE INVENTION

Problem to be Solved by the Invention

As described above, since the electron beam is influenced by both an electric field and a magnetic field of the specimen, results obtained by electromagnetic field measurement using the electron microscope simultaneously includes information about the electric field and that about the magnetic field. An amount of change in an electron wavefront influenced by the electromagnetic field is defined as a phase change $\varphi$, and an amount of the phase change in an x direction is given by the following equation.

[Mathematical Expression 1]

$$\phi(x) = C_E \int V(x, z)dz - \frac{e}{\hbar} \int \int B_y(x, z)dzdx \quad (1)$$

In Equation (1), V, z, e, the reduced Planck constant, and $B_y$ denote an electrostatic potential, an electron beam propagation direction, an electric charge of electrons, a number obtained by dividing the Planck constant by $2\pi$, and a y-direction component of the magnetic field, respectively.

Conventional methods of separating the electric field information and the magnetic field information mainly include three methods. A first method is according to procedures depicted in FIG. 1. Electromagnetic field information $F_A$ about a specimen mounted on an electron microscope (in S101) is measured (in S102), a front and a back of the specimen is then inverted (in S103) and electromagnetic field information $F_B$ is measured (S104). At this time, the two pieces of electromagnetic field information are given by the following Equations.

$$F_A = F_E + F_M \quad (2)$$

$$F_B = F_E - F_M \quad (3)$$

In Equations (2) and (3), $F_E$ denotes the electric field information and $F_M$ denotes the magnetic field information. The front and back inversion of the specimen causes inversion of a direction of the magnetic field with respect to the electron beam. Owing to this, inverting a change direction of the electron beam causes inversion of a sign of $F_M$ in Equation (3) with respect to Equation (2). By using these two measurement results while taking advantage of this nature, the electric field information and the magnetic field information that are obtained can be separated (in S105) by the following calculation equations.

$$F_E = (F_A + F_B)/2 \quad (4)$$

$$F_M = (F_A - F_B)/2 \quad (5)$$

A second method is according to procedures depicted in FIG. 2. After electromagnetic field information $F_A$ about a specimen is measured, a magnetic field is applied to the specimen to invert magnetization of the specimen (in S106) and magnetic field information $F_B$ is measured. The method of obtaining $F_E$ and $F_M$ from $F_A$ and $F_B$ is the same as that depicted in FIG. 1, with using Equations (4) and (5).

A third method is according to procedures depicted in FIG. 3. A specimen is heated to a temperature equal to or higher than a Curie point of a magnetic material, and electric field information B is measured in a state in which a magnetic property of the specimen is lost (in S107). At this time, $F_{B2}$ is given by the following equation.

$$F_{B2} = F_E \quad (6)$$

In addition, the magnetic field information can be obtained by the following calculation equation using Equations (2) and (6).

$$F_M = F_A - F_{B2} \quad (7)$$

Out of spatial resolutions of conventional electron microscopes at a time of observation of a magnetic field, a spatial resolution of a transmission electron microscope at an accelerating voltage of 300 kV has been approximately 2 nm. However, the recent development of a technique for aberration compensation of lenses of the electron microscope has enabled dramatic improvement in the spatial resolution of an electromagnetic field measuring apparatus. Albeit the improvement in the spatial resolution for electron microscope images, a problem associated with phase detection sensitivity remains unsolved. The problem is that if a resolution of an electron microscope improves and high resolution observation is carried out, then an amount of change in the electromagnetic field information between two points to be measured decreases and higher phase measurement precision is required of the observation. Therefore, a bottleneck of the high resolution electromagnetic field observation is insufficient measurement precision.

A detection lower limit in phase detection using the electron beam holography is given by the following equation.

[Mathematical Expression 2]

$$\delta\varphi = \frac{\sqrt{2}\, snr}{C\sqrt{N}} \qquad (8)$$

In Equation (8), C denotes a contrast of the interference fringes and N denotes the number of detected electrons and denotes the number of electron beams contributing to one pixel of a reconstructed image.

As indicated by this equation, it is known that it is possible to increase N, reduce measurement-related noise, and make a detection limit lower by obtaining a plurality of pieces of electromagnetic field information. An effect of lowering the detection limit by integration of the plurality of measurements can be obtained similarly in all of the aforementioned electromagnetic field measurement methods. It is, therefore, effective to perform a plurality of measurements and integrate the plurality of measurements for performing high precision electromagnetic field measurement. However, in acquiring $F_A$ and $F_B$ for the purpose of separating the electric field from the magnetic field, measuring the electromagnetic field information in a state B the M times after measuring the electromagnetic field information in a state A the M times, a time difference is generated between the measurement in the state A and that in the state B. This makes it difficult to satisfy a prerequisite condition that measurement information in Equations (2) and (3) is identical with respect to the electric field and the magnetic field.

One of factors is as follows. It is known that when the specimen is irradiated with the electron beam and observed, carbon-based deposits called contaminants are generated over time although an interior of the electron microscope is kept in a high vacuum. When the electromagnetic field information in the state B is measured the N times after measurement of the electromagnetic field information in the state A the N times, deposition of contaminants occurs due to the time difference between the measurement in the state A and that in the state B. A change in the electric field information between the measurement in the state A and that in the state B due to the contaminants are an artifact in the electromagnetic field measurement. At this time, an amount of phase change in the electron beam by the magnetic field information about 100 iron atoms strung in an electron beam transmission direction is approximately 1/300 wavelength, while an amount of phase change in an electron wave by the electric field information about one carbon atom is approximately 1/300 wavelength. As a result, in a case of measuring the electromagnetic field with a high-atomic-level spatial resolution, a new problem of a time change in the electric field information about one carbon atom level arises; thus, it has been demanded to invent a novel electromagnetic field measurement method for solving this problem.

Moreover, with the conventional methods in the high resolution observation, it is quite difficult to ensure position reconstruction characteristics and reconstruct a relationship between the electron beam and the specimen in the states A and B. With the method depicted in FIG. 1, it is difficult to reconstruct positions at an atomic level because of the physical front and back inversion of the specimen. With the method depicted in FIG. 3, a specimen drift deriving from thermal expansion occurs because of heating of the specimen, and the specimen drift is one of the factors that inhibit the high resolution observation. With the method by the magnetic field application depicted in FIG. 2, the specimen is out of mechanical contact; however, a conventional magnetic field application apparatus (Patent Document 2) has been developed with a view of observation of behaviors while the magnetic field is applied. Owing to this, an in-plane maximum applied magnetic field is 100 Oe to 400 Oe, resulting in restrictions on materials capable of complete magnetization inversion. To address the problems, a pulsed magnetic field application holder (Patent Document 3) that instantaneously generates a strong magnetic field and a magnetic field application holder (Patent Document 4) in which a distance between magnetic poles around which magnetic field application coils are wound is made narrow have been developed recently, and an in-plane magnetic field of approximately 3000 Oe can be applied. However, these conventional techniques simply relate to an apparatus that applies a magnetic field to a specimen and do not relate to an invention of a method of highly precisely separating the electric field and the magnetic field in the electromagnetic field measurement using the electron beam. In the light of results of considerations given so far, problems to be solved by the present invention are organized as follows.

A first problem is that with the methods depicted in FIGS. 1 and 3 by the front and back observation and observation of the heated specimen for the purpose of changing magnetization information in the electromagnetic field measurement using the electron beam, operating the specimen mechanically or thermally causes a position deviation or the specimen drift; thus, it is impossible to maintain a relationship between an observation position and the specimen relative to the electron beam in the high resolution observation.

A second problem is that the change in the electric field information caused by a difference of the time of performing the two types of measurement in which the magnetization information is changed deteriorates measurement precision.

A third problem is that magnetization of not only the specimen but also magnetic materials of an electron microscope main body minutely changes at a time of operating the specimen for magnetization inversion by the magnetic field application. This minute change in the magnetization state of the electron microscope is negligible at conventional low observation magnifications. However, because of high observation magnifications of electron microscopes each of which mounts an aberration compensator and the practical use of which is underway, changes in the position and shape of the electron beam with which the specimen is irradiated and a change in a route to the arrival of the electron beam transmitted through the specimen at an electron detector are regarded as new problems.

An object of the present invention is to provide an electron microscope that can overcome the problems, highly precisely separate an electric field and a magnetic field, and obtain magnetic field information with a high resolution in electromagnetic field measurement using an electron beam.

Means for Solving the Problem

To attain the object, the present invention provides an electron microscope for magnetic field measurement, including: a control analysis apparatus that accelerates an electron beam emitted from an electron source, that causes a converging lens to adjust an electron beam irradiation region in which a specimen is irradiated with the electron beam, that causes at least one or more magnifying lenses to adjust a projection magnification for the electron beam transmitted through the specimen to project the electron beam onto an electron detector and to analyze a detected signal, and that analyzes an electromagnetic field of the specimen; a magnetic field application coil that applies a magnetic field to the specimen; a coil that controls astigmatism of the electron beam with which the specimen is irradiated; an irradiation system deflection coil that controls an inclination and a position of the electron beam with which the specimen is irradiated; a coil that controls the astigmatism of the electron beam at a time of arrival of the electron beam transmitted through the specimen at the electron detector; and an imaging system deflection coil that controls an inclination and a position of the electron beam at the time of arrival of the electron beam transmitted through the specimen at the electron detector. The control analysis apparatus measures electromagnetic field information by repeating a plurality of times measurement of electromagnetic field information after a first magnetic field is applied to the specimen and measurement of electromagnetic field information after a second magnetic field is applied to the specimen, and calculates magnetic field information changed by magnetic field application from the measured electromagnetic field information.

Furthermore, to attain the object, the present invention provides a magnetic field measurement method by an electron microscope which includes: a control analysis apparatus that accelerates an electron beam emitted from an electron source, that adjusts an electron beam irradiation region in which a specimen is irradiated with the electron beam, that causes at least one or more magnifying lenses to adjust a projection magnification for the electron beam transmitted through the specimen to project the electron beam onto an electron detector and to analyze a detected signal, and that analyzes an electromagnetic field of the specimen; a magnetic field application coil that applies a magnetic field to the specimen; a coil that controls astigmatism of the electron beam with which the specimen is irradiated; an irradiation system deflection coil that controls an inclination and a position of the electron beam with which the specimen is irradiated; a coil that controls the astigmatism of the electron beam at a time of arrival of the electron beam transmitted through the specimen at the electron detector; and an imaging system deflection coil that controls an inclination and a position of the electron beam at the time of arrival of the electron beam transmitted through the specimen at the electron detector. The control analysis apparatus measures electromagnetic field information by repeating a plurality of times measurement of electromagnetic field information after a first magnetic field is applied to the specimen and measurement of electromagnetic field information after a second magnetic field is applied to the specimen a plurality of times, and calculates magnetic field information changed by magnetic field application from the measured electromagnetic field information.

Effect of the Invention

According to the present invention, it is possible to measure an electromagnetic field using an electron beam while highly precisely separating an electric field and a magnetic field, and realize magnetic field measurement precision required of electromagnetic field observation with a higher magnification.

BRIEF DESCRIPTION OF THE DRAWINGS

FIG. 4B is an explanatory diagram of a modification of the electromagnetic field measurement method according to the present invention and according to the first embodiment.

FIG. 9 is a timing chart for explaining the electromagnetic field measurement method according to the present invention and according to the first embodiment.

MODES FOR CARRYING OUT THE INVENTION

Various embodiments relating to an electron microscope of the present invention will be described hereinafter in accordance with the drawings. It is assumed that definition of a specimen includes a substance and an electromagnetic field around the substance for the description of an invention intended at electromagnetic field measurement in the present specification. In the electromagnetic field measurement of the present invention, magnetization of a specimen is inverted by applying a magnetic field, deflection of an electron beam by the magnetization of electron microscope main body components due to magnetic field application is controlled by various compensation coils and deflection coils such that the deflected electron beam appropriately arrives at an electron detector, and the electromagnetic field in magnetization inverted states is alternately measured to automatically measure an electromagnetic field, thereby separating an electric field and a magnetic field with high precision and obtaining magnetic field information with a high resolution in the electromagnetic field measurement using the electron beam.

A principle and a configuration of an electron microscope using an electromagnetic field measurement method of the present invention will first be explained with reference to a schematic diagram of FIG. 5A. While FIG. 5A also illustrates a configuration of a first embodiment of a transmission electron microscope that measures an electromagnetic field, contents to be explained below are similarly applicable to electron microscopes having configurations in other embodiments explained with reference to other drawings.

Figure 5A:
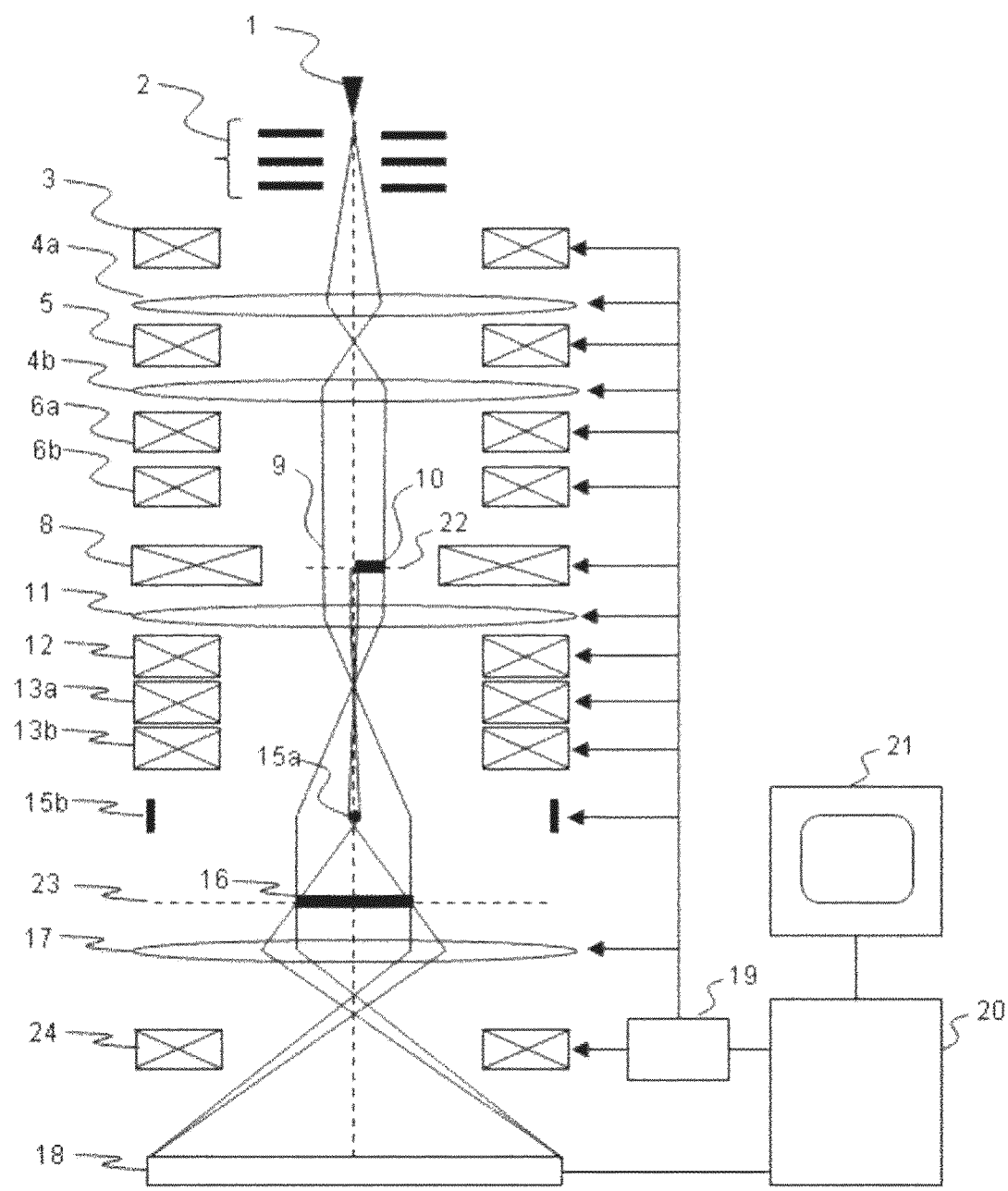
FIG. 5A is a schematic diagram of an electron microscope that measures an electromagnetic field using an electron beam biprism according to the present invention and according to the first embodiment.

In FIG. 5A, an electron source 1 is placed in a most upstream portion in an electron beam flow direction, an accelerating tube 2 accelerates the electron beam emitted from the electron source 1, converging lenses 4a and 4b act to adjust an electron beam irradiation region in which a specimen surface 22 on which a specimen 10 is placed is irradiated with an electron beam, a projection magnification of at least one or more magnifying lenses 17 is adjusted for the electron beam transmitted through the specimen 10 to project the resultant electron beam onto an electron detector 18, and the electron detector 18 detects the electron beam. A control analysis apparatus 20 analyzes a signal detected by the electron detector 18 to obtain an electromagnetic field of the specimen.

The present microscope includes a magnetic field application coil 8 that applies a magnetic field to the specimen 10, an electron gun deflection coil 3, an irradiation system astigmatic compensation coil 5 that controls astigmatism of the electron beam with which the specimen 10 is irradiated, irradiation system deflection coils 6a and 6b that control an inclination and a position of the electron beam with which the specimen 10 is irradiated, an imaging system astigmatic compensation coil 12 that controls astigmatism at a time of arrival of the electron beam transmitted through the specimen 10 at the electron detector 18, and imaging system deflection coils 13a and 13b that control an inclination and a position of the electron beam at the time of arrival of the electron beam transmitted through the specimen 10 at the electron detector 18.

With this configuration, measurement of electromagnetic field information by exercising first electron beam control over the electron beam arriving at the electron detector 18 from the electron source 1 after a first magnetic field is applied to the specimen 10, and measurement of electromagnetic field information by exercising second electron beam control over the electron beam arriving at the electron detector 18 from the electron source 1 after a second magnetic field is applied to the specimen 10 are automatically repeated a plurality of times. The electron beam control mentioned herein is exercised by the electron gun deflection coil 3, the irradiation system astigmatic compensation coil 5, the irradiation system deflection coils 6a and 6b, the imaging system astigmatic compensation coil 12, and the imaging system deflection coils 13a and 13b. Electric field information and magnetic field information are calculated from the electromagnetic field information obtained in these states by using Equations (4) and (5).

In the electron microscope of FIG. 5A, the electron source 1, the accelerating tube 2, excitation states of electron lenses 4a, 4b, 11, and 17, the magnetic field application coil 8, the electron gun deflection coil 3, the irradiation system astigmatic compensation coil 5, the irradiation system deflection coils 6a and 6b, the imaging system astigmatic compensation coil 12, the imaging system deflection coils 13a and 13b, and the electron detector 18 are connected to a power supply 19 and controlled by the control analysis apparatus 20.

It is noted that the control analysis apparatus 20 is an ordinary computer processing measured data and configured with a central processing unit (CPU) that is a processing section, a memory that is a storage section, an input/output monitor section, and the like which are mutually connected. In the present specification, an apparatus that controls the microscope and an apparatus that analyzes measurement results will be collectively referred as the "control analysis apparatus 20." It is noted that this control analysis apparatus 20 is not always configured with one computer but can be configured with, for example, a computer that controls the electron beam microscope and a computer that analyzes measurements results of the electron detector 18. In this case, a plurality of computers will be collectively referred to as the "control analysis apparatus 20." These computers each include the monitor 21 so that the user inputs the control information and confirms information about the microscope and analysis results.

As described above, the electron microscope utilizing the electromagnetic field measurement method of the present invention includes: an electron source; an accelerating tube that makes electrons emitted from the electron source into an electron beam having a predetermined velocity; at least one or more converging lens systems that irradiate a specimen with the electron beam; a specimen holding section that holds the specimen; at least one or more magnifying lens systems that project the electron beam transmitted through the specimen; an electron detector that detects the electron beam projected by the magnifying lens systems; a control analysis apparatus that analyzes a signal detected by the electron detector and that analyzes an electromagnetic field of the specimen; a magnetic field application coil that applies a magnetic field to the specimen; an electron gun deflection coil that guides a electron beam emitted from the electron source to the converging lens, a coil that controls astigmatism of the electron beam with which the specimen is irradiated, an irradiation system deflection coil that controls an inclination and a position of the electron beam with which the specimen is irradiated, a coil that controls astigmatism at a time of arrival of the electron beam transmitted through the specimen at the detector, and an imaging system deflection coil that controls an inclination and a position of the electron beam at the time of arrival of the electron beam transmitted through the specimen at the detector, and is configured such that the control analysis apparatus performs measurement by automatically repeating a plurality of times the measurement of electromagnetic field information in a state A by exercising first electron beam control over the electron beam arriving at the electron detector from the electron source after a first magnetic field is applied to the specimen, and the measurement of electromagnetic field information in a state B by exercising second electron beam control over the electron beam arriving at the electron detector from the electron source after a second magnetic field is applied to the specimen, and calculates magnetic field information changed by magnetic field application from the measured electromagnetic field information.

In the electromagnetic field measurement method realized by the present invention, the measurement in the state A and that in the state B are alternately performed a plurality of times and the repetitive measurement is essential to improving phase measurement precision; thus, a time difference between the measurement in the state A and that in the state B can be reduced. Therefore, it is possible to satisfy ideal conditions for Equations (2) and (3) that electric field information in the two types of measurement is maintained and only the magnetic field information is inverted, and to measure the magnetic field information with high precision. Furthermore, since the magnetization is inverted by magnetic field application, an observation position deviation or a specimen drift due to physical inversion or heating of the specimen does not occur and high resolution observation can be ensured.

Figure 1:
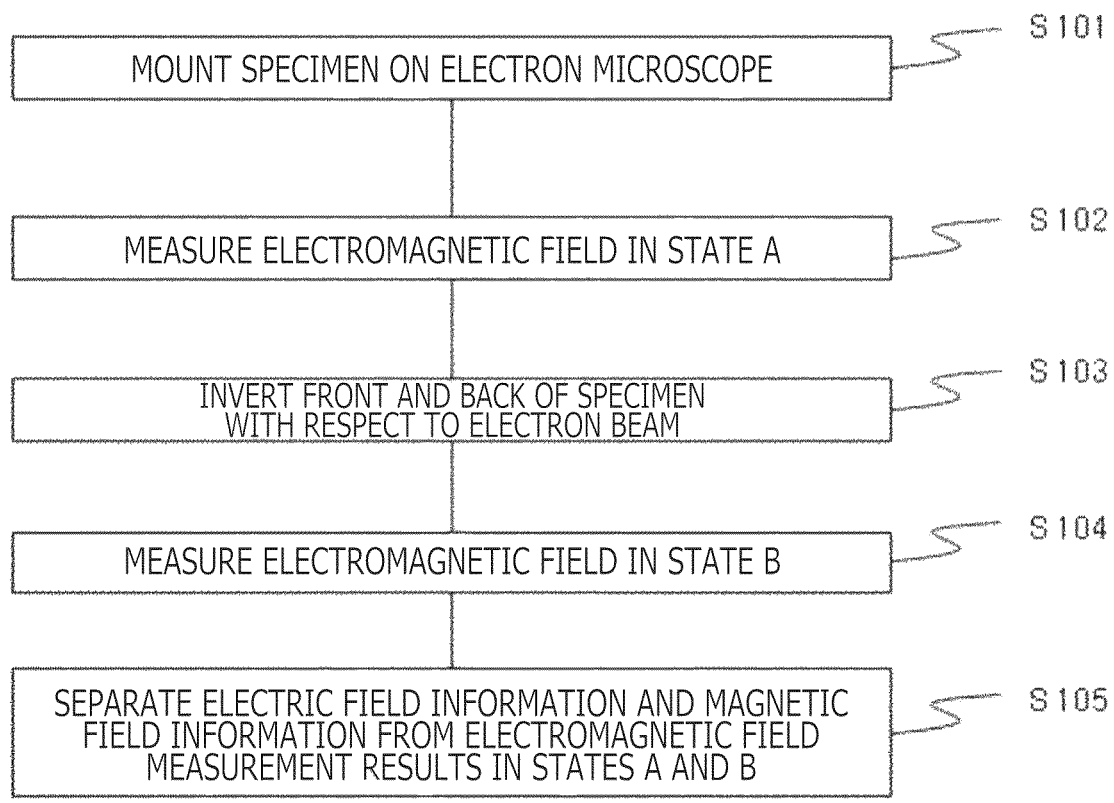
FIG. 1 depicts an example of procedures for electromagnetic field measurement according to a conventional method.
Figure 2:
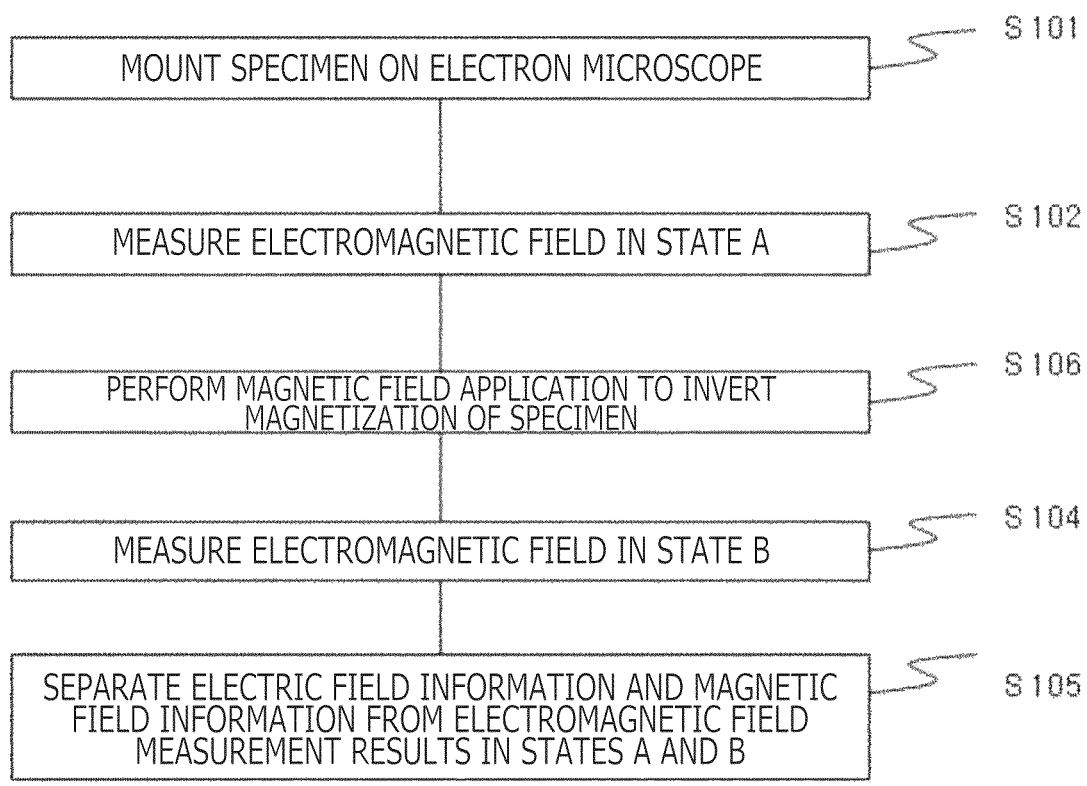
FIG. 2 depicts another example of procedures for electromagnetic field measurement according to a conventional method.
Figure 3:
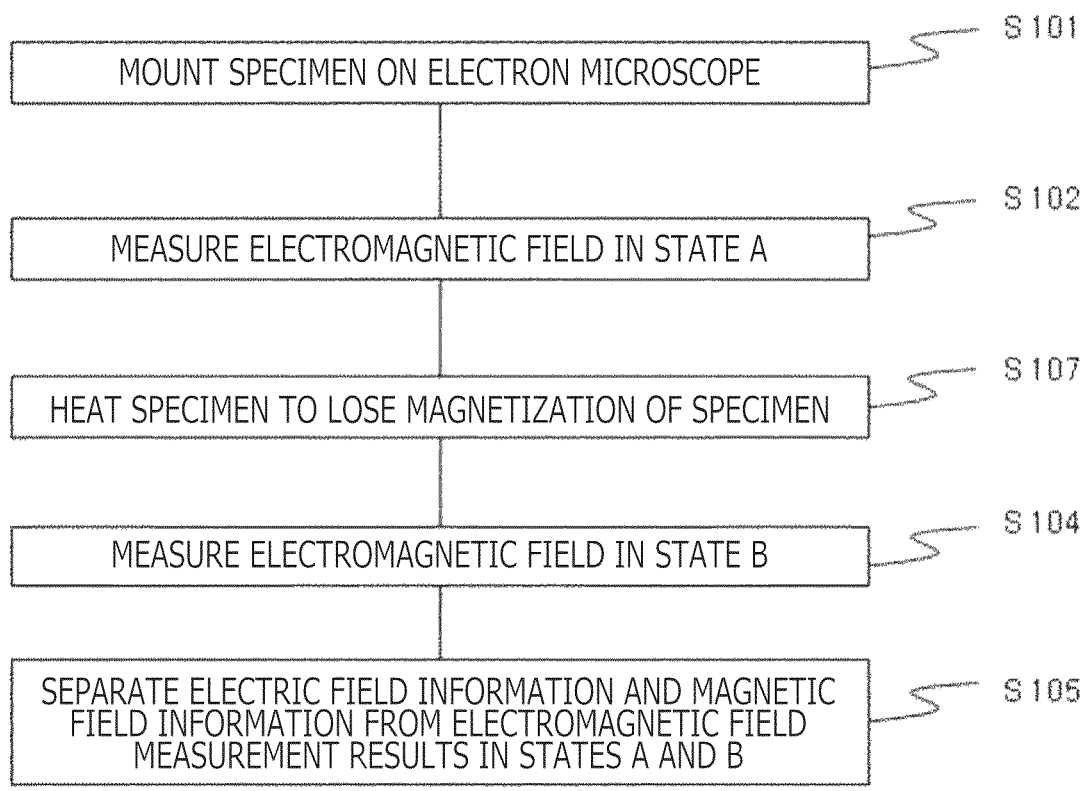
FIG. 3 depicts another example of procedures for electromagnetic field measurement according to a conventional method.
Figure 4A:
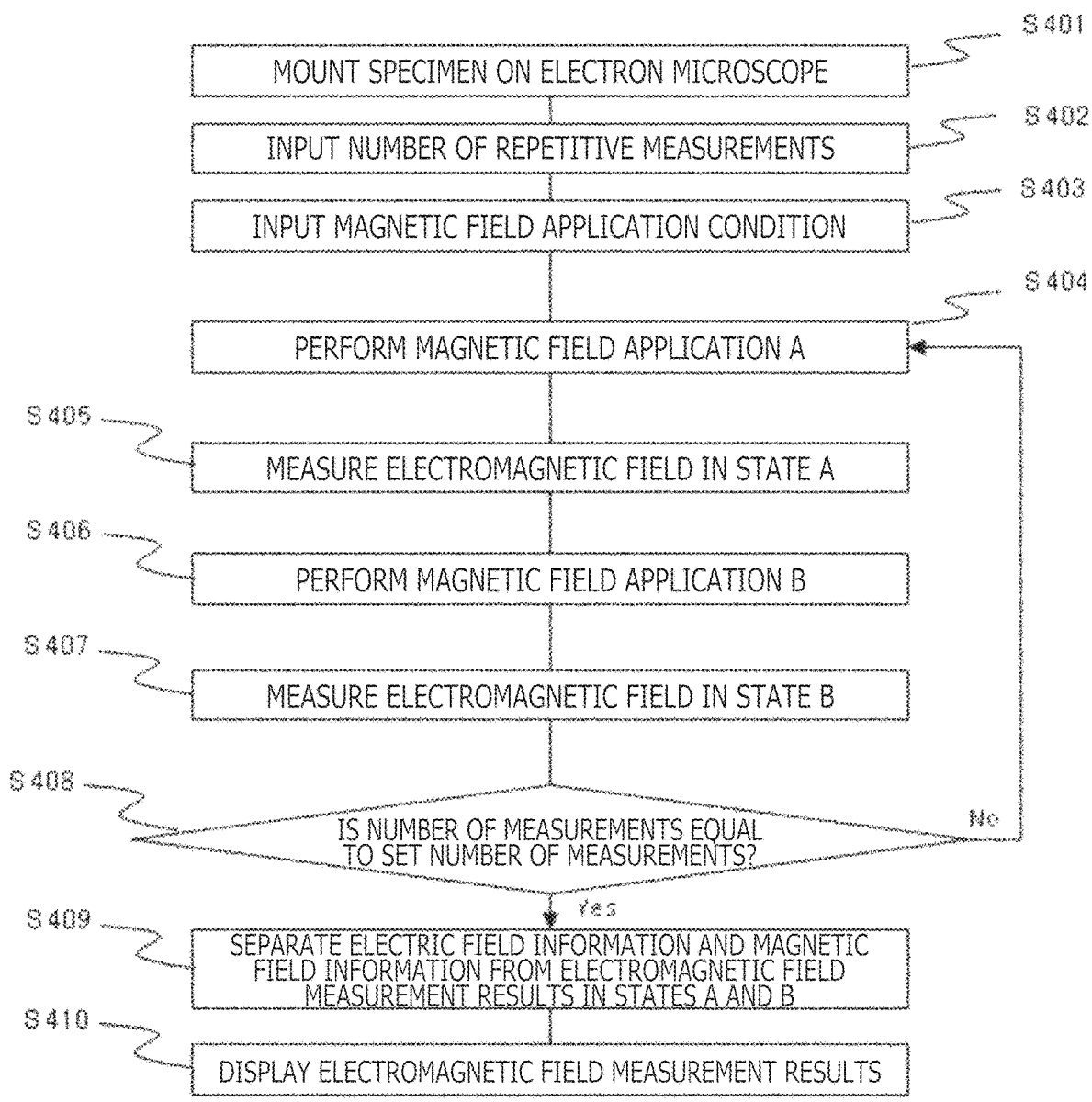
FIG. 4A is an explanatory diagram of a basic configuration of an electromagnetic field measurement method according to the present invention and according to a first embodiment.

FIG. 4A illustrates a flowchart for explaining a basic configuration of the electromagnetic field measurement method of the present invention. The specimen is mounted on the electron microscope depicted in FIG. 5A (in S401), the number of repetitive measurements is input (in S402), and a magnetic field application condition is input (in S403). Next, magnetic field application A is performed (in S404) and an electromagnetic field in the state A is measured (in S405). Subsequently, magnetic field application B is performed (in S406) and an electromagnetic field in the state B is measured (in S407). This measurement is repeated until the number of measurements becomes equal to the set number of measurements (in S408). Electric field information and magnetic field information are separated by calculation by Equations (4) and (5) from calculated electromagnetic field measurement results in the states A and B (in S409). The calculated electromagnetic field measurement results are displayed on the monitor 21 (in S410).

FIG. 4B illustrates a flowchart for explaining a modified configuration of the electromagnetic field measurement method of the present invention. In the present modification, the user selects whether to use an existing control condition (in S411), and control condition registration work is carried out if the existing control condition is not used. The control condition registration work is carried out as follows. First, the magnetic field application A is performed (in S412). In this state A, an optimum condition for the electron gun deflection coil 3, the irradiation system astigmatic compensation coil 5, the irradiation system deflection coils 6a and 6b, the imaging system astigmatic compensation coil 12, and the imaging system deflection coils 13a and 13b is registered as an electron beam control condition A (in S413). Next, the magnetic field application B is performed (in S414), and in this state B, an optimum condition for the electron gun deflection coil 3, the irradiation system astigmatic compensation coil 5, the irradiation system deflection coils 6a and 6b, the imaging system astigmatic compensation coil 12, and the imaging system deflection coils 13a and 13b is registered as an electron beam control condition B (in S415). These conditions along with a condition for the magnetic field applied to the specimen are stored as a magnetic field measurement control condition (in S416). The user can arbitrarily read and use this stored control condition.

The electromagnetic field measurement is performed repeatedly and automatically in accordance with the stored control conditions. In the repetitive measurement, the magnetic field application A is performed (in S418), the electron microscope is set to the electron beam control condition A (in S419), and the electromagnetic field in the state A is measured (in S420). Next, the magnetic field application B is performed (in S421), the electron microscope is set to the electron beam control condition B (in S422), and the electromagnetic field in the state B is measured (in S423). This measurement is repeated until the number of measurements becomes equal to the set number of measurements in a similar manner as in FIG. 4A. The electric field information and the magnetic field information are calculated by Equations (4) and (5) from calculated electromagnetic field measurement results in the states A and B measured, and the calculated electromagnetic field measurement results are displayed on the monitor 21.

FIG. 9 illustrates a timing chart corresponding to the flowchart of the electromagnetic field measurement method explained with reference to FIG. 4B. As clear from FIG. 9, the magnetic field application A is performed in response to a magnetic field pulse 1, and the electron beam control condition A is set, an image 1 is acquired by an output from the electron detector 18, and the image 1 is stored in the memory of the control analysis apparatus 20 in a BD1 set. Subsequently, the magnetic field application B is performed in response to a magnetic field pulse 2 of a reversed polarity, and the electron beam control condition B is set, an image 2 is acquired, and the image 2 is stored in the memory of the control analysis apparatus 20 in a BD2 set. Such measurement processes 91 and 92 are repeated by the set number of measurements and the electromagnetic field measurement results are calculated and displayed.

With the electromagnetic field measurement method of the present invention described above in detail, it is possible to compensate for an influence of the electron beam by very weak magnetization of the electron microscope main body due to the magnetic field application and to separate the electric field and the magnetic field with high precision. Furthermore, the electromagnetic field measurement in the two magnetized states can be performed without an observation position deviation and a specimen drift and can be performed with a change in the electric field information kept small; thus, it is possible to perform the magnetic field measurement with a high resolution that has been difficult to perform with the conventional methods. It is noted that the principle and the configuration explained so far are similarly applicable to the electron microscopes other than that in FIG. 5A. Several embodiments of the present invention will now be explained in accordance with the drawings.

First Embodiment

Figure 5B:
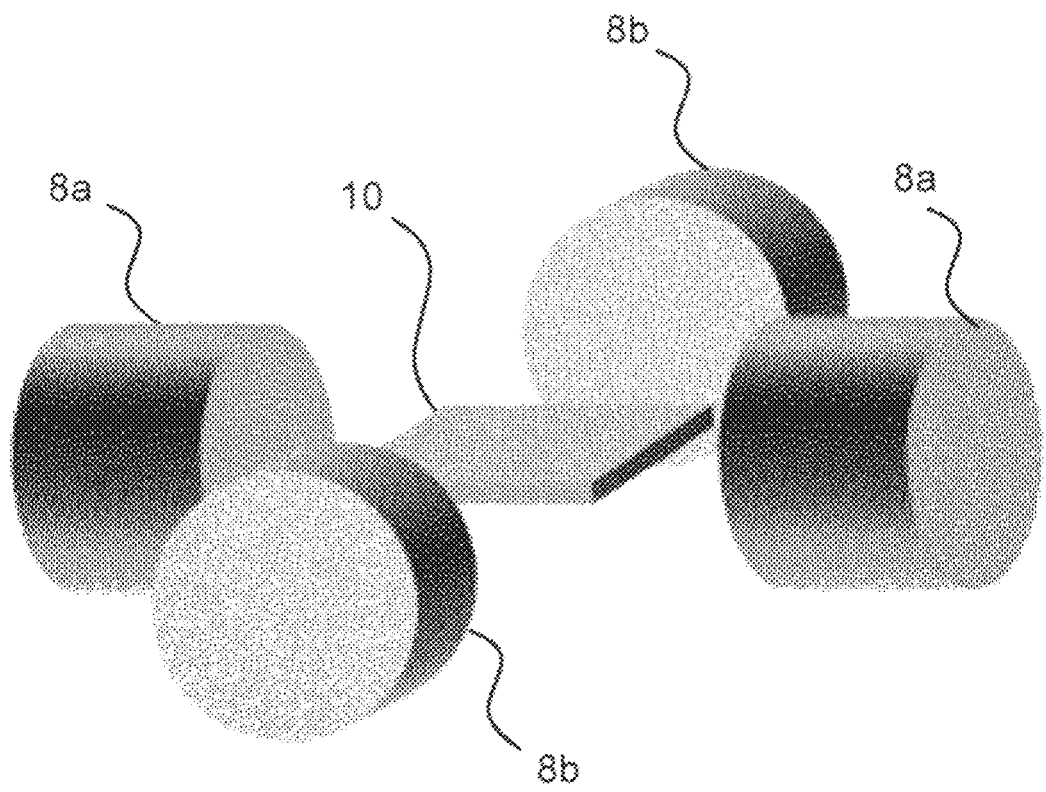
FIG. 5B is a specific configuration diagram of a magnetic field application coil used in the electron microscope according to the first embodiment.

FIGS. 5A and 5B typically illustrate optical systems of the electron microscope related to the first embodiment. The present embodiment is an embodiment of an electron microscope for magnetic field measurement that further includes an objective lens between the specimen and the magnifying lens and an electron beam biprism between the specimen and the electron detector for realizing the basic configuration of the electromagnetic field measurement method described above, and that is configured such that the electron beam biprism deflects an object wave transmitted through the specimen and another reference wave passing through a reference region in a perpendicular direction to an electron beam travel direction, the electron detector acquires interference fringes between the object wave and the reference wave, and the control analysis apparatus analyzes the interference fringes to obtain the electromagnetic field information about the specimen.

In FIG. 5A, the electron source 1 is placed in the most upstream portion in the electron beam flow direction, the accelerating tube 2 accelerates the electron beam emitted from the electron source 1, the converging lenses 4a and 4b act to adjust the electron beam irradiation region in which the specimen surface 22 on which a specimen 10 is placed is irradiated with the electron beam, the projection magnification of at least one or more magnifying lenses 17 is adjusted for the electron beam transmitted through the specimen 10 to project the resultant electron beam onto the electron detector 18, and the electron detector 18 detects the electron beam. The electron microscope includes the electron beam biprism that is provided between the specimen 10 and the magnifying lens 17 and that is configured with a filament electrode 15a and a plate electrode 15b, this electron beam biprism deflects the object wave transmitted through the specimen and another reference wave passing through the reference region in the perpendicular direction to the electron beam travel direction, and the interference fringes are obtained on an image surface 23. The interference fringes are magnified by the magnifying lens 17 and the electron detector 18 obtains the interference fringes between the object wave and the reference wave. The control analysis apparatus 20 analyzes the signal detected by the electron detector 18 to obtain the electromagnetic field of the specimen. The interference fringes detected by the electron detector 18 are subjected to a reconstruction process by the control analysis apparatus 20 either immediately or after being temporarily stored in the control analysis apparatus 20, and projected onto the monitor 21 that is an interface as the electromagnetic field information. Since an established method is known for this reconstruction process, the reconstruction process will not be described herein in detail. The nature of an action of the electron beam biprism is to interfere the object wave with the reference wave and the electron beam biprism may be placed upstream in a specimen direction of an any of image surfaces in an imaging system; thus, the microscope is not limited to the configuration depicted in FIG. 5A.

The electron microscope of the present embodiment includes the magnetic field application coil 8 that applies a magnetic field to the specimen 10, the electron gun deflection coil 3, the irradiation system astigmatic compensation coil 5 that controls the astigmatism of the electron beam with which the specimen 10 is irradiated, the irradiation system deflection coils 6a and 6b that control the inclination and the position of the electron beam with which the specimen 10 is irradiated, the imaging system astigmatic compensation coil 12 that controls the astigmatism at the time of arrival of the electron beam transmitted through the specimen 10 at the electron detector, and the imaging system deflection coils 13a and 13b that control the inclination and the position of the electron beam at the time of arrival of the electron beam transmitted through the specimen 10 at the electron detector 18, and the electron microscope repeats automatically and a plurality of times the measurement of the electromagnetic field information by exercising the first electron beam control over the electron beam arriving at the electron detector 18 from the electron source 1 after the first magnetic field is applied to the specimen 10, and the measurement of the electromagnetic field information by exercising the second electron beam control over the electron beam arriving at the electron detector 18 from the electron source 1 after the second magnetic field is applied to the specimen 10. The electron beam control mentioned herein is exercised by the electron gun deflection coil 3, the irradiation system astigmatic compensation coil 5, the irradiation system deflection coils 6a and 6b, the imaging system astigmatic compensation coil 12, and the imaging system deflection coils 13a and 13b.

This magnetic field application condition and a phenomenon that the components of the electron microscope are minutely magnetized by an influence of the magnetic field application condition have a relationship determined uniquely to each microscope. Owing to this, a data file of the electron beam control is stored in the memory of the control analysis apparatus 20, and, as explained with reference to FIG. 4B, this data file is called for every magnetic field application condition. The control analysis apparatus 20 can control the electron gun deflection coil 3, the irradiation system astigmatic compensation coil 5, the irradiation system deflection coils 6a and 6b, the imaging system astigmatic compensation coil 12, and the imaging system deflection coils 13a and 13b under the registered condition. This control enables the user to change setting of the applied magnetic field on the specimen surface and perform measurement without stress. In addition, the electric field information and the magnetic field information are calculated from the electromagnetic field information in the two magnetized states obtained in this way by using Equations (4) and (5).

In the electron microscope of FIG. 5A, the electron source 1, the accelerating tube 2, the excitation states of the electron lenses, the magnetic field application coil 8, the electron gun deflection coil 3, the irradiation system astigmatic compensation coil 5, the irradiation system deflection coils 6a and 6b, the imaging system astigmatic compensation coil 12, the imaging system deflection coils 13a and 13b, and the electron detector 18 are connected to the power supply 19 and controlled by the control analysis apparatus 20. It is noted that the magnetic field application coil 8 that applies the magnetic field may be configured with an X-direction magnetic field application coil 8a and a Y-direction magnetic field application coil 8b, and may apply magnetic fields in X and Y directions with an optical axis of the electron microscope assumed as a Z direction, as depicted in FIG. 5B.

The actual electron microscope includes, in addition to the constituent elements depicted in this schematic diagram, a specimen fine adjustment mechanism that holds and finely adjusts the specimen 10, an aperture mechanism that limits a region transmitted by the electron beam, and the like. Those elements are also connected to the power supply 19 and controlled by the control analysis apparatus 20. However, these devices are not directly related to the electron microscope according to the present embodiment and are not, therefore, depicted in FIG. 5A.

It is noted that the control analysis apparatus 20 has an ordinary computer configuration to include the central processing unit (CPU) that is the processing section, the memory that is the storage section, the input/output monitor section, and the like which are mutually connected, and to process the measured data. In the present specification, an apparatus that controls the microscope and an apparatus that analyzes measurement results will be collectively referred as the "control analysis apparatus 20." It is noted that this control analysis apparatus 20 is not always configured with one computer but can be configured with, for example, a computer that controls the electron beam microscope, a computer that actuates the electron detector 18, and a computer that analyzes the measurement results. In this case, a plurality of computers will be collectively referred to as the "control analysis apparatus 20." These computers each include the monitor 21 so that the user inputs the control information and confirms information about the microscope and analysis results. Furthermore, the electron-optical elements are components contained in a vacuum container and continuously evacuated by a vacuum pump. The vacuum container and the vacuum system are not directly related to the electron microscope according to the present embodiment, either, and are not, therefore, depicted and explained.

Second Embodiment

Figure 6:
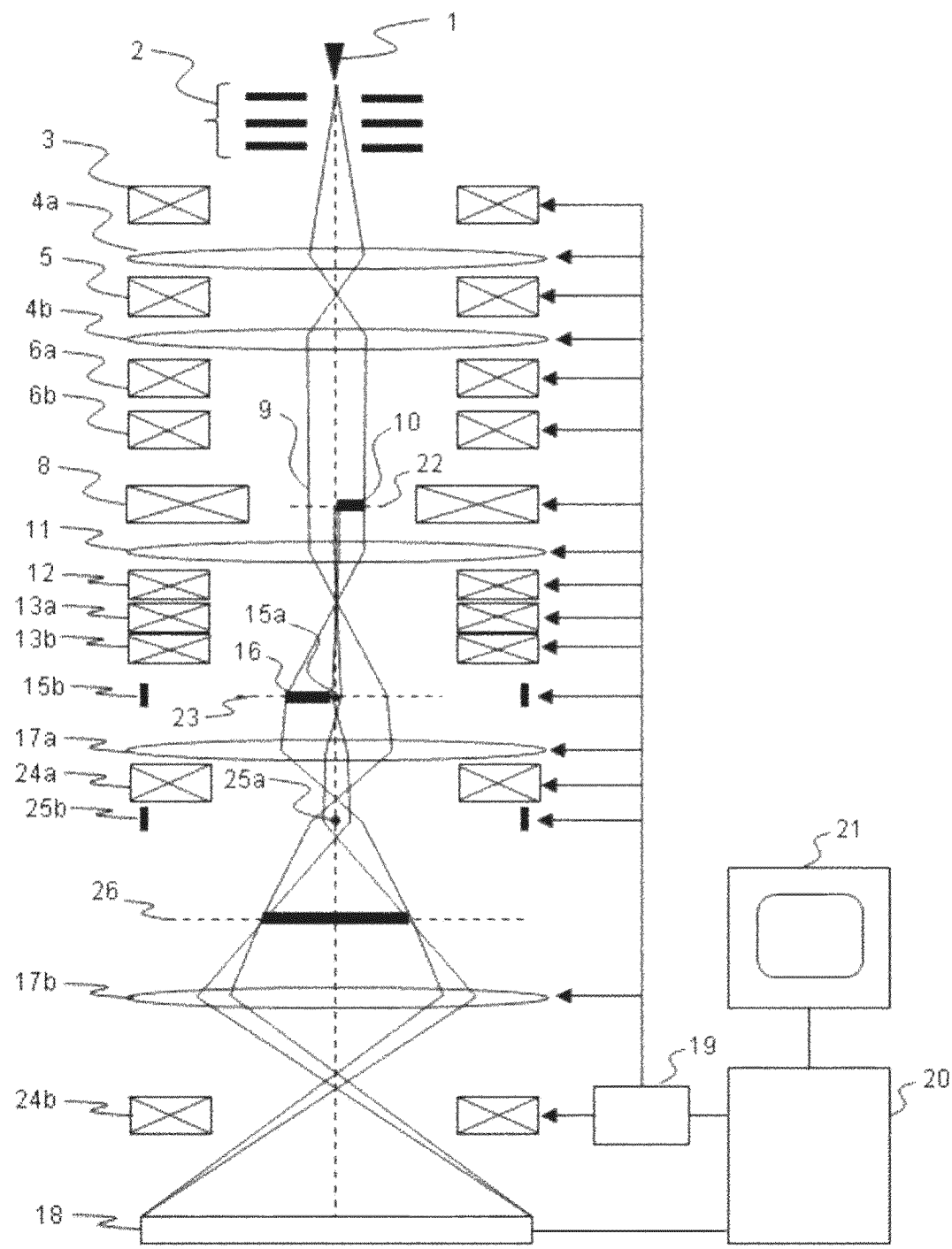
FIG. 6 is a schematic diagram of an electron microscope that measures an electromagnetic field using two electron beam biprisms according to a second embodiment.

FIG. 6 is a schematic diagram illustrating an example of a configuration of an electron microscope according to a second embodiment. The present embodiment is an embodiment of an electron microscope for magnetic field measurement that includes the objective lens between the specimen and the magnifying lens and two electron beam biprisms between the specimen and the electron detector for realizing the basic configuration of the electromagnetic field measurement method described above, and that is configured such that the filament electrode of the upper electron beam biprism is placed on the image surface of the imaging system, a filament electrode of the lower electron beam biprism is disposed at a position of a shadow created by the upper electron beam biprism, the two electron beam biprisms deflect the object wave transmitted through the specimen and another reference wave passing through the reference region in the perpendicular direction to the electron beam travel direction, the electron detector acquires interference fringes between the object wave and the reference wave, and the control analysis apparatus analyzes the interference fringes to obtain the electromagnetic field information about the specimen.

The electron microscope of the present embodiment has the two electron beam biprisms installed between the specimen 10 and the electron detector 18, differently from the first embodiment. Since the microscope system is similar in configuration to that of the first embodiment, the description of the same parts as those in the first embodiment will be omitted and respects different in microscope configuration from those of the first embodiment will be described herein.

The filament electrode 15a of the upper electron beam biprism is placed on the image surface 23 of the imaging system, and a filament electrode 25a of the lower electron beam biprism is disposed at the position of the shadow created by the upper electron beam biprism. At this time, the filament electrode 15a of the upper electron beam biprism is on the image surface. Owing to this, the electron beam is imaged on a second image surface 26 and on the electron detector 18 onto which the electron beam is projected by a magnifying lens 17b, so that no Fresnel fringes are generated. On the other hand, the lower biprism is not irradiated with the electron beam, so that no Fresnel fringes are generated from the lower biprism, either. Since the electron microscope includes the two biprisms in the imaging system in this way and a method for obtaining interference fringes are described in Patent Document 1 and the like, no explanation will be given herein.

The second embodiment can realize the basic principle of the present invention described above and yet freely control interference fringe spacing and an interference region that are important parameters in the electron beam holography by actions of the upper biprism and the lower biprism. Therefore, high operability is ensured and even a user unfamiliar with the electron beam holography can easily operate the electron microscope. Furthermore, since no Fresnel fringes are generated, it is possible to perform high precision phase measurement. The essential features of the present embodiment are that the position of the upper biprism is at any of the image surfaces in the imaging system equivalent to the image surface 23 and the position of the lower biprism is at the shadow created by the upper biprism, and the configuration of the electron microscope is not limited to that depicted in FIG. 6.

Third Embodiment

Figure 7:
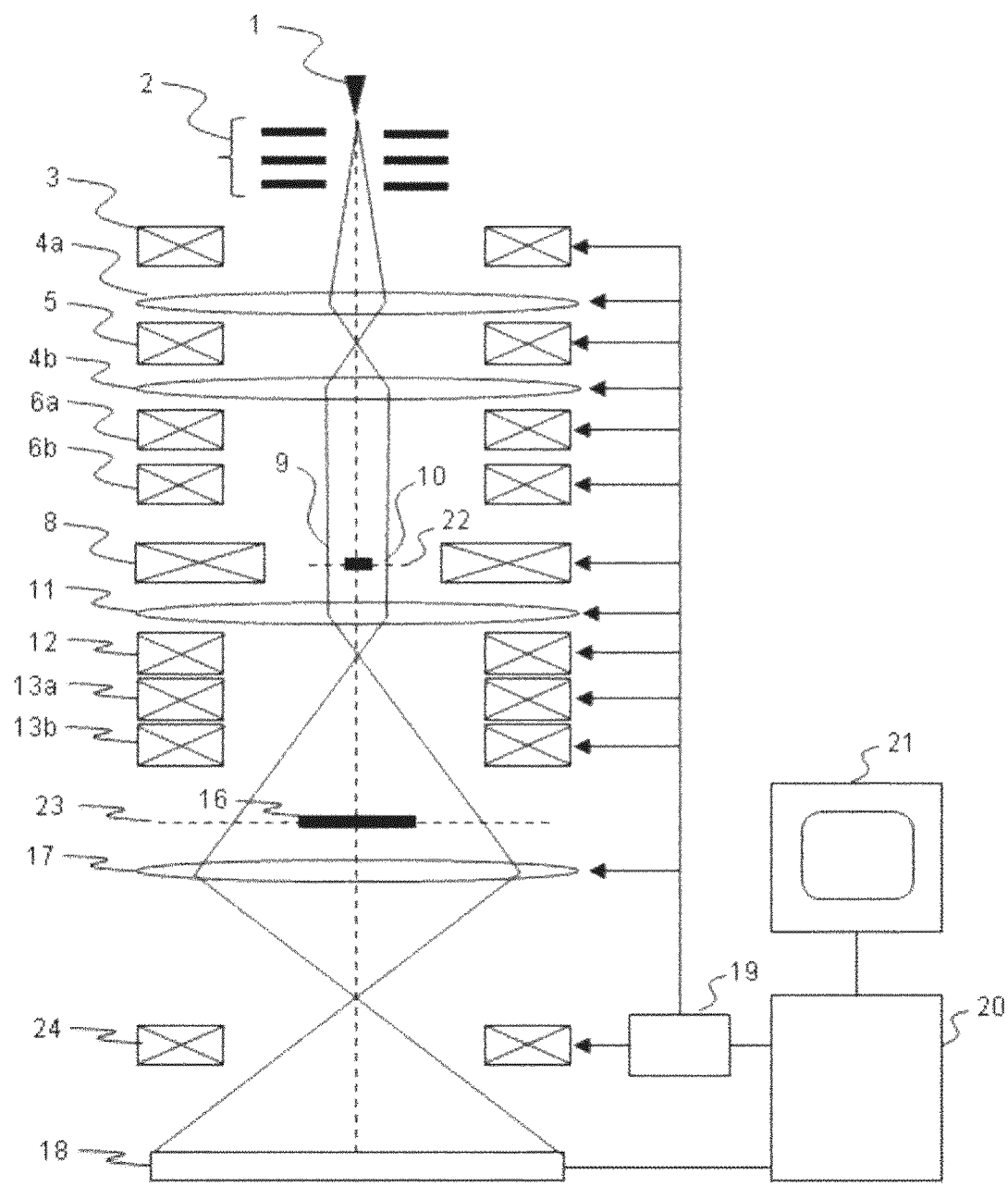
FIG. 7 is a schematic diagram of an electron microscope that measures an electromagnetic field by changing a focal point according to a third embodiment.

FIG. 7 is a schematic diagram illustrating an example of a configuration of an electron microscope according to a third embodiment. The present embodiment is an embodiment of an electron microscope for magnetic field measurement that includes the objective lens between the specimen and the magnifying lens for realizing the basic configuration of the electromagnetic field measurement method described above, and that is configured such that transmission electron microscope images are acquired by changing a focal point of the images projected onto the electron detector, and that the control analysis apparatus analyzes the transmission electron microscope images to obtain the electromagnetic field information about the specimen.

The electron microscope of the third embodiment is configured with the specimen 10 and the objective lens 11 in this order. Since the microscope system is similar in configuration to that of the first embodiment, the description of the same parts as those in the first embodiment will be omitted and respects different in microscope configuration from those of the first embodiment will be described herein.

In the third embodiment, the electron beam biprism is not provided between the specimen 10 and the electron detector 18. In a series of electromagnetic field measurement, at a time of measuring the magnetic field in the state A and that in the state B, the objective lens 11 and the magnifying lens 17 change the focal point for the image of the specimen 10 projected onto the electron detector 18 to acquire at least two or more transmission electron microscope images, and the control analysis apparatus analyzes changes in intensity distributions of the plurality of obtained transmission electron microscope images to obtain the electromagnetic field information about the specimen. The control analysis apparatus 20 analyzes the signal detected by the electron detector 18 to obtain the electromagnetic field of the specimen. The plurality of transmission electron microscope images detected by the electron detector 18 are subjected to a reconstruction process by the control analysis apparatus 20 either immediately or after being temporarily stored in the memory in the control analysis apparatus 20, and projected onto the monitor 21 that is the interface as the electromagnetic field information. Since an established method is known for this reconstruction process and described in Non-Patent Document 1 in detail, the reconstruction process will not be described in detail.

With the configuration of the present embodiment, it is possible to realize the basic principle of the present invention described above even if the electron microscope is configured such that the electron beam biprism is not installed.

Fourth Embodiment

Figure 8:
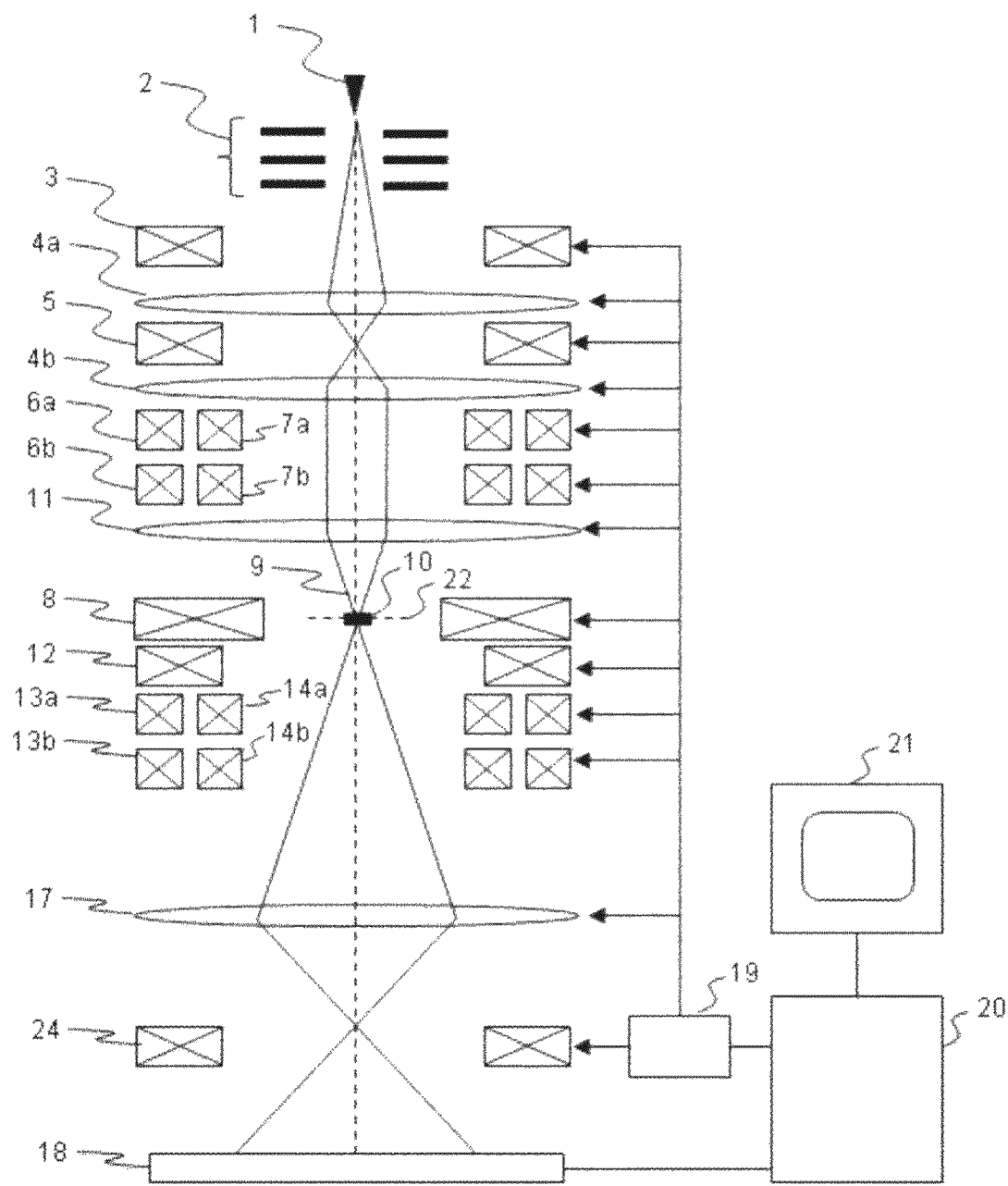
FIG. 8 is a schematic diagram of an electron microscope that analyzes a change in a position at which an electron beam transmitted by a specimen arrives at an electron detector and measures an electromagnetic field according to a fourth embodiment.

FIG. 8 is a schematic diagram illustrating an example of a configuration of an electron microscope according to a fourth embodiment. The present embodiment is an embodiment of an electron microscope for magnetic field measurement that includes the objective lens between the converging lenses and the specimen, irradiation system scan coils between the electron source and the specimen, and imaging system scan coils between the specimen and the electron detector for realizing the basic configuration of the electromagnetic field measurement method described above, and that is configured such that the control analysis apparatus causes the irradiation system scan coils to scan the electron beam with which the specimen is irradiated, causes the imaging system scan coils to work with the irradiation system scan coils and to scan the electron beam so that the electron beam arrives at the electron detector, and the electron detector analyzes a change in a position of the detected electron beam to obtain the electromagnetic field information about the specimen.

The electron microscope of the fourth embodiment is configured with the objective lens 11 and the specimen 10 in this order. Since the microscope system is similar in configuration to that of the first embodiment, the description of the same parts as those in the first embodiment will be omitted and respects different in microscope configuration from those of the first embodiment will be described herein. In this fourth embodiment, the electron beam biprism is not provided between the specimen 10 and the electron detector 18. Furthermore, the objective lens 11 is placed on a side of the specimen 10 near the electron source 1 for nailing down the electron beam to the specimen and irradiating the specimen with the electron beam. Moreover, the electron microscope of the fourth embodiment includes irradiation system scan coils 7a and 7b between the electron source 1 and the specimen 10, and imaging system scan coils 14a and 14b between the specimen 10 and the electron detector 18, the irradiation system scan coils 7a and 7b scan the electron beam 9 with which the specimen is irradiated, and the imaging system scan coils 14a and 14b work with the irradiation system scan coils 7a and 7b and scan the electron beam so that the electron beam transmitted through the specimen 10 arrives at the electron detector 18.

In a series of electromagnetic field measurement using the configuration of the present embodiment, at a time of measuring the magnetic field in the state A and that in the state B, at least one or more magnifying lenses 17 adjust a magnitude of the electron beam transmitted through the specimen 10 and projected onto the electron detector 18 and the electron detector 18 detects the electron beam. The control analysis apparatus 20 analyzes the position of the electron beam detected by the electron detector 18 to obtain the electromagnetic field of the specimen. Since the electron beam is narrowed down and radiated onto the specimen, the electron beam is scanned two-dimensionally and electromagnetic field information in each location is measured for obtaining two-dimensional information. Measurement results are processed by the control analysis apparatus 20 either immediately or after being temporarily stored in the control analysis apparatus 20 to obtain the electromagnetic field information. The obtained results are projected onto the monitor 21. Since an established method is known as this electromagnetic field measurement method and the electromagnetic field measurement is described in Non-Patent Document 2 in detail, the method will not be described in detail.

In the present embodiment, the electron microscope in which the electron beam biprism is not installed can realize the basic principle of the present invention described above. In addition, since the electron beam is narrowed down and radiated, it is possible to perform composition analysis in each location and simple measurement of a composition image by detecting electrons scattered from the specimen at large angles as well as the measurement of the electromagnetic field information.

The electron microscope of the present invention that realizes the configurations of the various embodiments described so far is put into practical use as a high resolution electron microscope for magnetic field measurement, implementing the present invention by any of these electron microscopes enables magnetic field observation on the nano to atomic scale, and the present invention is expected to be able to be utilized in the research and development of base materials, semiconductor devices, and spintronics materials or spintronics devices.

The present invention is not limited to the embodiments described above but encompasses various modifications. For example, the above embodiments have been explained in detail for helping better understanding of the present invention. The present invention is not always limited to the embodiments having all the explained configurations. Furthermore, the configuration of a certain embodiment can be partially replaced by the configuration of the other embodiment or the configuration of the other embodiment can be added to the configuration of the certain embodiment. Moreover, for apart of the configuration of each embodiment, additions, omissions, and substitutions of the other configurations can be made.

Furthermore, an example in which a program that realizes a part or all of each of the configurations, the functions, and the control analysis apparatus described above is generated has been explained. However, it goes without saying that a part or all thereof may be realized by hardware by, for example, designing a part or all thereof in an integrated circuit. In other words, all or a part of the functions of the processing section may be realized by, for example, an integrated circuit such as an ASIC (application specific integrated circuit) or an FPGA (field programmable gate array).

DESCRIPTION OF REFERENCE CHARACTERS

1: Electron source
2: Accelerating tube
3: Electron gun deflection coil
4a, 4b: Converging lens
5: Irradiation system astigmatic compensation coil
6a: Irradiation system upper deflection coil
6b: Irradiation system lower deflection coil
7a: Irradiation system upper scan coil
7b: Irradiation system lower scan coil
8: Magnetic field application coil
8a: X-direction magnetic field application coil
8b: Y-direction magnetic field application coil
9: Irradiation electron beam
10: Specimen
11: Objective lens
12: Imaging system astigmatic compensation coil
13a: Imaging system upper deflection coil
13b: Imaging system lower deflection coil
14a: Imaging system upper scan coil
14b: Imaging system lower scan coil
15a, 25a: Filament electrode
15b, 25b: Plate electrode
16: Magnified image
17: Magnifying lens
18: Electron detector
19: Power supply
20: Control analysis apparatus
21: Monitor
22: Specimen surface
23: Image surface
24: Magnifying lens deflection coil
25: Second electron beam biprism
26: Second image surface
91, 92: Measurement process

The invention claimed is:
1. An electron microscope for magnetic field measurement, comprising:
 a control analysis apparatus that accelerates an electron beam emitted from an electron source, that causes a converging lens to adjust an electron beam irradiation region in which a specimen is irradiated with the electron beam, that causes at least one or more magnifying lenses to adjust a projection magnification for the electron beam transmitted through the specimen to project the electron beam onto an electron detector and to analyze a detected signal, and that analyzes an electromagnetic field of the specimen;

a magnetic field application coil that applies a magnetic field to the specimen;

a coil that controls astigmatism of the electron beam with which the specimen is irradiated;

an irradiation system deflection coil that controls an inclination and a position of the electron beam with which the specimen is irradiated;

a coil that controls the astigmatism of the electron beam at a time of arrival of the electron beam transmitted through the specimen at the electron detector; and an imaging system deflection coil that controls an inclination and a position of the electron beam at the time of arrival of the electron beam transmitted through the specimen at the electron detector, wherein the control analysis apparatus measures electromagnetic field information by repeating a plurality of times measurement of electromagnetic field information after a first magnetic field is applied to the specimen and measurement of electromagnetic field information after a second magnetic field is applied to the specimen, and calculates magnetic field information changed by magnetic field application from the measured electromagnetic field information.

2. The electron microscope for magnetic field measurement according to claim 1, wherein the control analysis apparatus measures the electromagnetic field information by exercising first electron beam control over the electron beam arriving at the electron detector from the electron source after the first magnetic field is applied to the specimen, and measures the electromagnetic field information by exercising second electron beam control over the electron beam arriving at the electron detector from the electron source after the second magnetic field is applied to the specimen.

3. The electron microscope for magnetic field measurement according to claim 2, wherein the magnetic field application coil is configured with an X-direction magnetic field application coil and a Y-direction magnetic field application coil that apply magnetic fields in X and Y directions, respectively, where an optical axis of the electron microscope for magnetic field measurement is assumed to be in a Z direction.

4. The electron microscope for magnetic field measurement according to claim 2, comprising:

an objective lens between the specimen and the magnifying lenses; and an electron beam biprism between the specimen and the electron detector, wherein the electron beam biprism deflects an object wave transmitted through the specimen and another reference wave passing through a reference region in a perpendicular direction to an electron beam travel direction, the electron detector acquires interference fringes between the object wave and the reference wave, and the control analysis apparatus analyzes the interference fringes and obtains the electromagnetic field information about the specimen.

5. The electron microscope for magnetic field measurement according to claim 2, comprising:

an objective lens between the specimen and the magnifying lenses; and two electron beam biprisms between the specimen and the electron detector, wherein a filament electrode of the upper electron beam biprism is placed on an image surface of an imaging system, a filament electrode of the lower electron beam biprism is disposed at a position of a shadow created by the upper electron beam biprism, and the two electron beam biprisms deflect an object wave transmitted through the specimen and another reference wave passing through a reference region in a perpendicular direction to an electron beam travel direction, the electron detector acquires interference fringes between the object wave and the reference wave, and the control analysis apparatus analyzes the interference fringes to obtain the electromagnetic field information about the specimen.

6. The electron microscope for magnetic field measurement according to claim 2, comprising an objective lens between the specimen and the magnifying lenses, wherein transmission electron microscope images are acquired by changing a focal point of the images projected onto the electron detector, and the control analysis apparatus analyzes the transmission electron microscope images to obtain the electromagnetic field information about the specimen.

7. The electron microscope for magnetic field measurement according to claim 2, comprising:

an objective lens between the converging lens and the specimen; an irradiation system scan coil between the electron source and the specimen; and an imaging system scan coil between the specimen and the electron detector, wherein the control analysis apparatus causes the irradiation system scan coil to scan the electron beam with which the specimen is irradiated, causes the imaging system scan coil to work with the irradiation system scan coil and to scan the electron beam so that the electron beam arrives at the electron detector, and analyzes a change in a position of the electron beam detected by the electron detector to obtain the electromagnetic field information about the specimen.

8. The electron microscope for magnetic field measurement according to claim 1, wherein the magnetic field application coil is configured with an X-direction magnetic field application coil and a Y-direction magnetic field application coil that apply magnetic fields in X and Y directions, respectively, where an optical axis of the electron microscope for magnetic field measurement is assumed to be in a Z direction.

9. The electron microscope for magnetic field measurement according to claim 1, comprising:

an objective lens between the specimen and the magnifying lenses; and an electron beam biprism between the specimen and the electron detector, wherein the electron beam biprism deflects an object wave transmitted through the specimen and another reference wave passing through a reference region in a perpendicular direction to an electron beam travel direction, the electron detector acquires interference fringes between the object wave and the reference wave, and the control analysis apparatus analyzes the interference fringes and obtains the electromagnetic field information about the specimen.

10. The electron microscope for magnetic field measurement according to claim 1, comprising:
  an objective lens between the specimen and the magnifying lenses; and two electron beam biprisms between the specimen and the electron detector, wherein
  a filament electrode of the upper electron beam biprism is placed on an image surface of an imaging system,
  a filament electrode of the lower electron beam biprism is disposed at a position of a shadow created by the upper electron beam biprism, and
  the two electron beam biprisms deflect an object wave transmitted through the specimen and another reference wave passing through a reference region in a perpendicular direction to an electron beam travel direction, the electron detector acquires interference fringes between the object wave and the reference wave, and the control analysis apparatus analyzes the interference fringes to obtain the electromagnetic field information about the specimen.

11. The electron microscope for magnetic field measurement according to claim 1, comprising
  an objective lens between the specimen and the magnifying lenses, wherein
  transmission electron microscope images are acquired by changing a focal point of the images projected onto the electron detector, and
  the control analysis apparatus analyzes the transmission electron microscope images to obtain the electromagnetic field information about the specimen.

12. The electron microscope for magnetic field measurement according to claim 1, comprising:
  an objective lens between the converging lens and the specimen; an irradiation system scan coil between the electron source and the specimen; and an imaging system scan coil between the specimen and the electron detector, wherein
  the control analysis apparatus
  causes the irradiation system scan coil to scan the electron beam with which the specimen is irradiated,
  causes the imaging system scan coil to work with the irradiation system scan coil and to scan the electron beam so that the electron beam arrives at the electron detector, and
  analyzes a change in a position of the electron beam detected by the electron detector to obtain the electromagnetic field information about the specimen.

13. A magnetic field measurement method by an electron microscope, wherein
  the electron microscope
  comprises a control analysis apparatus that accelerates an electron beam emitted from an electron source, that adjusts an electron beam irradiation region in which a specimen is irradiated with the electron beam, that causes at least one or more magnifying lenses to adjust a projection magnification for the electron beam transmitted through the specimen to project the electron beam onto an electron detector and to analyze a detected signal, and that analyzes an electromagnetic field of the specimen; a magnetic field application coil that applies a magnetic field to the specimen; a coil that controls astigmatism of the electron beam with which the specimen is irradiated; an irradiation system deflection coil that controls an inclination and a position of the electron beam with which the specimen is irradiated; a coil that controls the astigmatism of the electron beam at a time of arrival of the electron beam transmitted through the specimen at the electron detector; and an imaging system deflection coil that controls an inclination and a position of the electron beam at the time of arrival of the electron beam transmitted through the specimen at the electron detector, and wherein
  the control analysis apparatus
  measures electromagnetic field information by repeating a plurality of times measurement of electromagnetic field information after a first magnetic field is applied to the specimen and measurement of electromagnetic field information after a second magnetic field is applied to the specimen a plurality of times, and calculates magnetic field information changed by magnetic field application from the measured electromagnetic field information.

14. The magnetic field measurement method according to claim 13, wherein
  the control analysis apparatus
  measures the electromagnetic field information by exercising first electron beam control over the electron beam arriving at the electron detector from the electron source after the first magnetic field is applied to the specimen, and measures the electromagnetic field information by exercising second electron beam control over the electron beam arriving at the electron detector from the electron source after the second magnetic field is applied to the specimen.

15. The magnetic field measurement method according to claim 13, wherein
  the control analysis apparatus
  exercises control such that a magnetic field pulse is applied to the magnetic field application coil to apply the first magnetic field to the specimen, and that a magnetic field pulse of a reversed polarity with respect to a polarity of the former magnetic field pulse to apply the second magnetic field pulse to the specimen.

* * * * *